United States Patent
Yeh et al.

(10) Patent No.: US 7,763,923 B2
(45) Date of Patent: Jul. 27, 2010

(54) METAL-INSULATOR-METAL CAPACITOR STRUCTURE HAVING LOW VOLTAGE DEPENDENCE

(75) Inventors: Der-Chyang Yeh, Hsinchu (TW); Chie-Iuan Lin, Hsinchu (TW); Chuan-Ying Lee, Hsinchu (TW); Yi-Ting Chao, Hsinchu (TW); Ming-Hsien Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 519 days.

(21) Appl. No.: 11/322,209

(22) Filed: Dec. 29, 2005

(65) Prior Publication Data
US 2007/0152295 A1  Jul. 5, 2007

(51) Int. Cl.
*H01L 27/108* (2006.01)
(52) U.S. Cl. .............. 257/303; 257/506; 257/532; 257/602; 257/E27.016
(58) Field of Classification Search ................ 257/301, 257/506, 508, 516, 532, 303, 602; 438/396
See application file for complete search history.

(56) References Cited

U.S. PATENT DOCUMENTS

| | | | | |
|---|---|---|---|---|
| 4,878,151 A * | 10/1989 | Gallichio | ............ | 361/329 |
| 4,949,154 A * | 8/1990 | Haken | ............ | 257/311 |
| 5,208,597 A * | 5/1993 | Early et al. | ............ | 341/172 |
| 5,773,872 A * | 6/1998 | Kobatake | ............ | 257/532 |
| 6,222,221 B1 * | 4/2001 | Hou et al. | ............ | 257/307 |
| 6,303,957 B1 * | 10/2001 | Ohwa | ............ | 257/307 |
| 6,459,562 B1 * | 10/2002 | KarRoy et al. | ............ | 361/312 |
| 6,680,521 B1 * | 1/2004 | Kar-Roy et al. | ............ | 257/532 |
| 6,885,081 B2 | 4/2005 | Morimoto | ............ | 257/532 |
| 2002/0056869 A1 * | 5/2002 | Morimoto | ............ | 257/313 |
| 2002/0075736 A1 * | 6/2002 | Kumura et al. | ............ | 365/200 |
| 2004/0077141 A1 * | 4/2004 | Kim | ............ | 438/240 |
| 2004/0104420 A1 * | 6/2004 | Coolbaugh et al. | ............ | 257/310 |
| 2006/0151823 A1 * | 7/2006 | Govindarajan | ............ | 257/310 |
| 2007/0132049 A1 * | 6/2007 | Stipe | ............ | 257/421 |

FOREIGN PATENT DOCUMENTS
CN  1489213  4/2004

OTHER PUBLICATIONS
"Engineering of Voltage Nonlinearity in High-K MIM Capacitor for Analog/Mixed-Signal ICs" Kim et al.; 2004; pp. 218-219.
CN Office Action mailed Apr. 25, 2008.
English abstract of CN1489213.

\* cited by examiner

*Primary Examiner*—Wai-Sing Louie
(74) *Attorney, Agent, or Firm*—Thomas, Kayden, Horstemeyer & Risley

(57) ABSTRACT

A semiconductor capacitor device. A dielectric layer is on a substrate. A stack capacitor structure is disposed in the dielectric layer and comprises first and overlying second MIM capacitors electrically connected in parallel. The first and second MIM capacitors have individual upper and lower electrode plates and different compositions of capacitor dielectric layers.

20 Claims, 2 Drawing Sheets

METAL-INSULATOR-METAL CAPACITOR STRUCTURE HAVING LOW VOLTAGE DEPENDENCE

BACKGROUND OF THE INVENTION

1. Field of the Invention

The present invention relates to a semiconductor device, and in particular to a metal-insulator-metal (MIM) capacitor structure that increases capacitance density while keeping the voltage linearity coefficient (VCC) value low.

2. Description of the Related Art

Reduced circuit area is an important concern in microelectronics technology. Integrated circuits continue to increase in circuit density due to the reduced size of circuit components. As more components are incorporated into an integrated circuit, higher performance in the circuit can be achieved. One type circuit component that is increasingly incorporated into integrated circuit designs, such as mixed signal, radio frequency, and analog circuits, is a metal-insulator-metal (MIM) capacitor, which typically includes a stacked arrangement of materials of upper and lower metal electrode plates and an intermediate capacitor dielectric layer.

MIM capacitors in such integrated circuit designs, however, may occupy a large portion of the circuit area. In order to reduce the size of circuit components in the integrated circuit, it is desirable to reduce the circuit area occupied by MIM capacitors. Accordingly, an increase in the capacitance density ($fF/\mu m^2$) of the capacitor is required, thereby proving a suitable capacitance from the MIM capacitor within a smaller circuit area.

Generally, there are several approaches to increase the capacitance density of the MIM capacitor. For example, use of high dielectric constant (k) dielectric materials, such as silicon nitride or hafnium oxide for a capacitor dielectric layer, reduction of the thickness of the capacitor dielectric layer, or combinations thereof. As capacitance density is increased, however, the voltage linearity coefficient (VCC) value ($ppm/V^2$) tends to increase as well. This is undesirable to mixed signal, radio frequency, and analog circuits because they typically require closer capacitor matching and relatively good voltage linearity (low voltage dependence or low VCC value).

Thus, there exists a need in the art for development of improved MIM capacitors which have a high capacitance density while keeping a relatively low VCC value.

BRIEF SUMMARY OF INVENTION

A detailed description is given in the following embodiments with reference to the accompanying drawings. A semiconductor capacitor device is provided. An embodiment of a semiconductor capacitor device comprises a dielectric layer on a substrate. A stack capacitor structure is disposed in the dielectric layer and comprises first and overlying second MIM capacitors electrically connected in parallel. The first and second MIM capacitors have individual upper and lower electrode plates and different compositions of capacitor dielectric layers.

Another embodiment of a semiconductor capacitor device comprises a dielectric layer on a substrate. A stack capacitor structure is disposed in the dielectric layer and comprises a first MIM capacitor using silicon oxide as a capacitor dielectric layer with negative VCC parabolic characteristic and a second MIM capacitor using a capacitor dielectric layer with positive VCC parabolic characteristic, electrically connected in parallel. The first and second MIM capacitors have individual upper and lower electrode plates.

Yet another embodiment of a semiconductor capacitor device comprises a dielectric layer on a substrate. A stack capacitor structure is disposed in the dielectric layer, comprising a first MIM capacitor using silicon oxide as a capacitor dielectric layer and a second MIM capacitor using a high k dielectric material as a capacitor dielectric layer, electrically connected in parallel, wherein the first and second MIM capacitors have individual upper and lower electrode plates. A plurality of first interconnects is disposed in the dielectric layer, electrically connecting the upper electrode plate of the first MIM capacitor and the lower electrode plate of the second MIM capacitor. A plurality of second interconnects is disposed in the dielectric layer, electrically connecting the lower electrode plate of the first MIM capacitor and the upper electrode plate of the second MIM capacitor Yet another embodiment of a semiconductor capacitor device comprises a dielectric layer on a substrate. A MIM capacitor is disposed in the dielectric layer and comprises an upper electrode plate, a first capacitor dielectric layer, a second capacitor dielectric layer, and a lower electrode plate, wherein the first capacitor dielectric layer has a composition and thickness different from the second capacitor dielectric layer. First and second damascene interconnects are in the dielectric layer, electrically connected to the upper and lower electrode plates, respectively.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. The semiconductor capacitor device of this invention will be described below with reference to the accompanying drawings.

Figure 1A:
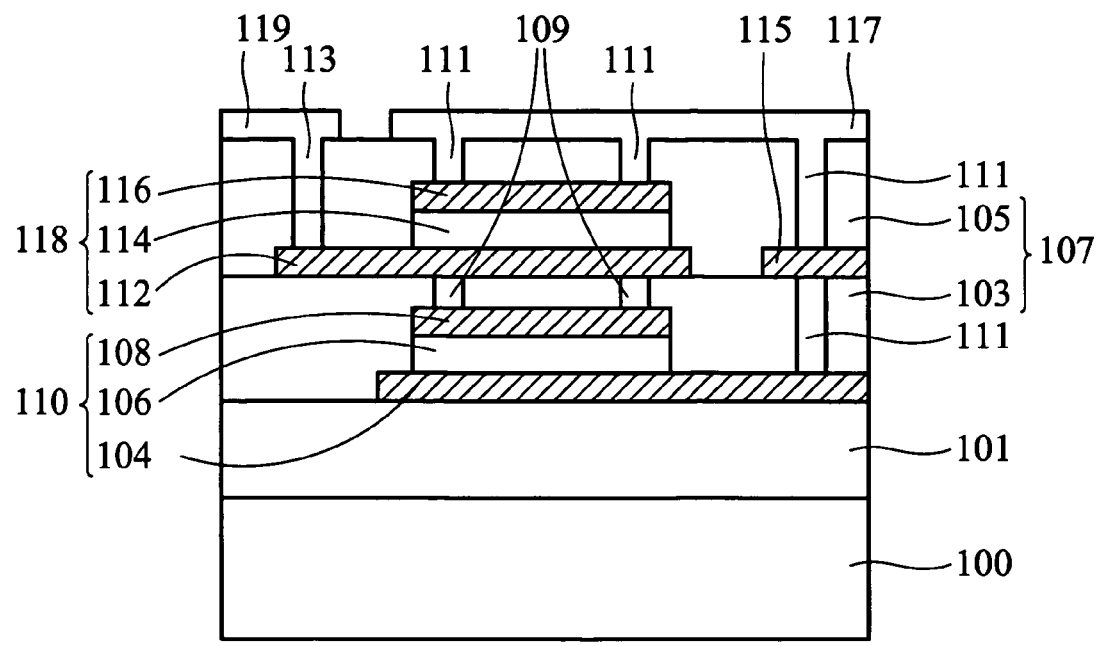
FIG. 1A shows a cross-section of an embodiment of a semiconductor capacitor device having MIM capacitors electrically connected in parallel.

The invention relates to an improved semiconductor capacitor device for different integrated circuit designs, such as mixed signal, radio frequency, and analog circuits, thereby increasing capacitance density while keeping the VCC value low. FIG. 1A illustrates an embodiment of a semiconductor capacitor device. In FIG. 1A, a substrate 100 is provided. The substrate 100, such as a silicon substrate or other semiconductor substrates, may contain a variety of elements, including, for example, transistors, resistors, and other semiconductor elements as are well known in the art. In order to simplify the diagram, a flat substrate is depicted. A dielectric layer 101, serving as an interlayer dielectric (ILD) or intermetal dielectric (IMD) layer overlies the substrate 100. For example, the dielectric layer 101 may be silicon dioxide, phosphosilicate glass (PSG), borophosphosilicate glass (BPSG). Preferably, the dielectric layer 106 comprises a low dielectric constant (k) material to achieve low RC time constant (resistance-capacitance), such as fluorosilicate glass (FSG). The dielectric layer 101 can be formed by conventional deposition, such as plasma enhanced chemical vapor deposition (PECVD), low pressure CVD (LPCVD), atmospheric pressure CVD (APCVD), high-density plasma CVD (HDPCVD) or other suitable CVD. Additionally, a multiple level metal structure may be disposed in the dielectric layer 101, thereby electrically connecting the elements in or on the substrate 100 and the subsequent electronic devices thereon. As well as the substrate 100, a flat layer is depicted in order to simplify the diagram.

Another dielectric layer 107 overlies the dielectric layer 101. In this embodiment, the dielectric layer 107 serves as an IMD layer. The dielectric layer 107 may comprise a material similar to the dielectric layer 101 and be formed by a method similar that of forming dielectric layer 101. Moreover, the dielectric layer 107 may be a single layer or a multiple layer. In this embodiment, the dielectric layer 107 comprises a lower dielectric layer 103 and an upper dielectric layer 105. The dielectric layer 103 may comprise the same material or different than that of the dielectric layer 105.

A stack capacitor structure is embedded in the dielectric layer 107. In this embodiment, the stack capacitor structure may comprise a first MIM capacitor 110 and a second MIM capacitor 118 thereon, in which the first and second MIM capacitors 110 and 118 are electrically connected in parallel. The first MIM capacitor 110 may be disposed in the lower dielectric layer 103 and may comprise a lower electrode plate 104, an upper electrode plate 108 and an intermediate capacitor dielectric layer 106. The upper and lower electrode plates 108 and 104 may comprise Cu, AlCu or other metal electrode materials well known in the art. The capacitor dielectric layer 106 may comprise silicon oxide or other material having a dielectric constant (k) higher than silicon oxide, such as silicon nitride, silicon oxynitride, hafnium oxide and tantalum oxide.

The second MIM capacitor 118 may be disposed in the upper dielectric layer 105 above the first MIM capacitor 110 and comprise a lower electrode plate 112, an upper electrode plate 116 and an intermediate capacitor dielectric layer 114. The upper and lower electrode plates 116 and 112 may comprise Cu, AlCu or other metal electrode materials well known in the art. The capacitor dielectric layer 114 may comprise silicon oxide or other material having a dielectric constant (k) higher than silicon oxide, such as silicon nitride, silicon oxynitride, hafnium oxide and tantalum oxide.

In particular, in this embodiment, the composition of the capacitor dielectric layer 114 of the second MIM capacitor 118 is different from that of the capacitor dielectric layer 106 of the first MIM capacitor 110. That is, one of the capacitor dielectric layers 106 and 114 requires a negative VCC parabolic characteristic and the other a positive VCC parabolic characteristic, where VCC indicates the change of capacitance with voltage over an operating range. For example, if the first MIM capacitor 110 employs silicon oxide (negative VCC parabolic characteristic) as a capacitor dielectric, the second MIM capacitor 118 may employ a material having a dielectric constant higher than silicon oxide (positive VCC parabolic characteristic), such as silicon nitride or silicon oxynitride. Conversely, the second MIM capacitor 118 may employ silicon oxide as a capacitor dielectric and the first MIM capacitor 118 a material having a dielectric constant higher than silicon oxide, such as silicon nitride or silicon oxynitride. In this embodiment, the thickness of the capacitor dielectric layer 106 may be substantially equal to or different from the capacitor dielectric layer 114. Preferably, the capacitor dielectric layer comprising silicon oxide is thicker than that comprising a material having a relatively high dielectric constant.

Figure 1B:
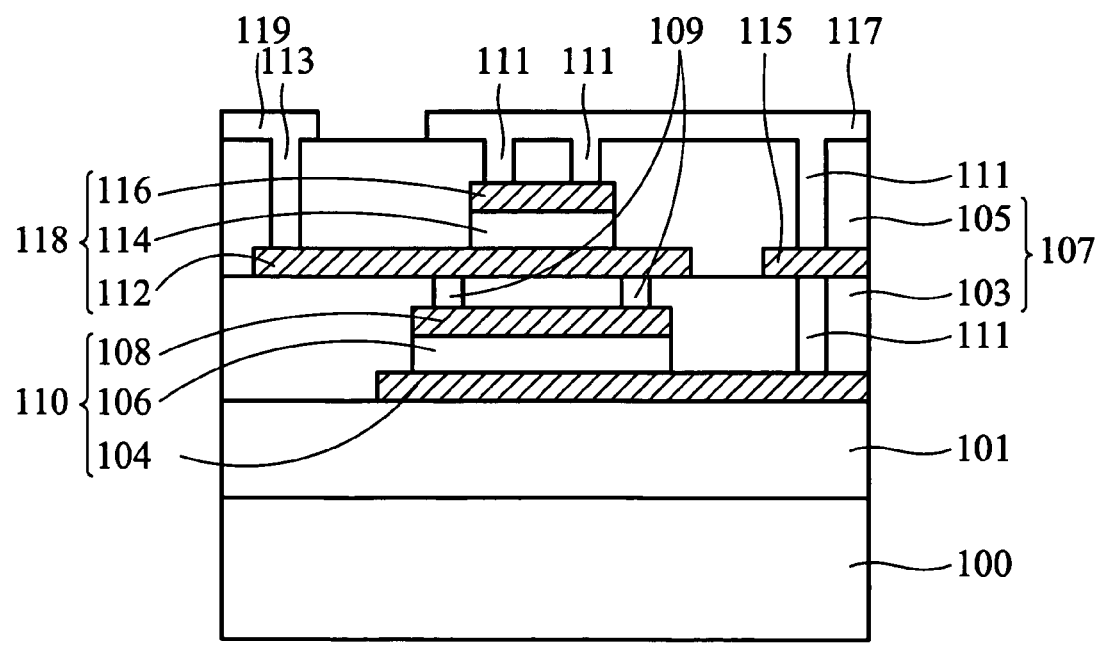
FIG. 1B shows a cross-section of another embodiment of a semiconductor capacitor device having MIM capacitors electrically connected in parallel.

In order to electrically connect the first and second MIM capacitors 110 and 118 in parallel, a plurality of first interconnects 109 is formed in the dielectric layer 103, electrically connecting the upper electrode plate 108 of the first MIM capacitor 110 to the lower electrode plate 112 of the second MIM capacitor 118, and a plurality of second interconnects 111 is formed in the dielectric layer 105, electrically connecting the lower electrode plate 104 of the first MIM capacitor 110 to the upper electrode plate 116 of the second MIM capacitor 118. A metal wiring layer 119, serving as one of the input/output terminals of the semiconductor capacitor device, overlies the dielectric layer 107 and is electrically connected to the lower electrode plate 112 of the second MIM capacitor 118 through an interconnect 113 formed in the dielectric layer 105. A metal wiring layer 117, serving as the other input/output terminals of the semiconductor capacitor device, overlies the dielectric layer 107 and is electrically connected to the upper electrode plate 116 of the second MIM capacitor 118 through the plurality of the second interconnects 111. An intermediate metal wiring layer 115 is formed in the dielectric layer 107, thereby electrically connecting the metal wiring layer 117 to the lower electrode plate 104 of the first MIM capacitor 110 through the overlying and underlying second interconnects 111. The metal wiring layers 115, 117 and 119, the interconnects 109, 111 and 113 may comprise copper or other suitable metal materials and be formed by, for example, conventional single or dual damascene process. In this embodiment, the plurality of the first interconnects 109 underlies the second MIM capacitor 118 and overlaps the capacitor dielectric layer 114 thereof. In some embodiments, the plurality of first interconnects 109 may underlie the second MIM capacitor 118 without overlapping the capacitor dielectric layer 114 thereof, as shown in FIG. 1B.

Since the semiconductor capacitor device comprises a stack capacitor structure comprising A MIM capacitor with a high k capacitor dielectric, the invention can provide increased capacitance density as does the related art (i.e. a single MIM capacitor using a high k material as a capacitor dielectric). High k dielectric material may comprise titanium oxide, barium strontium titanate, zirconium oxide, hafnium silicon oxide, zirconium silicon oxide, hafnium aluminum oxide, zirconium aluminum oxide or strontium titanium oxide. Moreover, since the semiconductor capacitor device comprises two MIM capacitors having opposite VCC characteristics, the total VCC value can be minimized by the opposing VCC values canceling each other out. Compared to the single MIM capacitor of the related art, the semiconductor capacitor device of the invention has better voltage linearity. Thus, the operating voltage range of the integrated circuits using MIM capacitors can be increased.

Figure 2A:
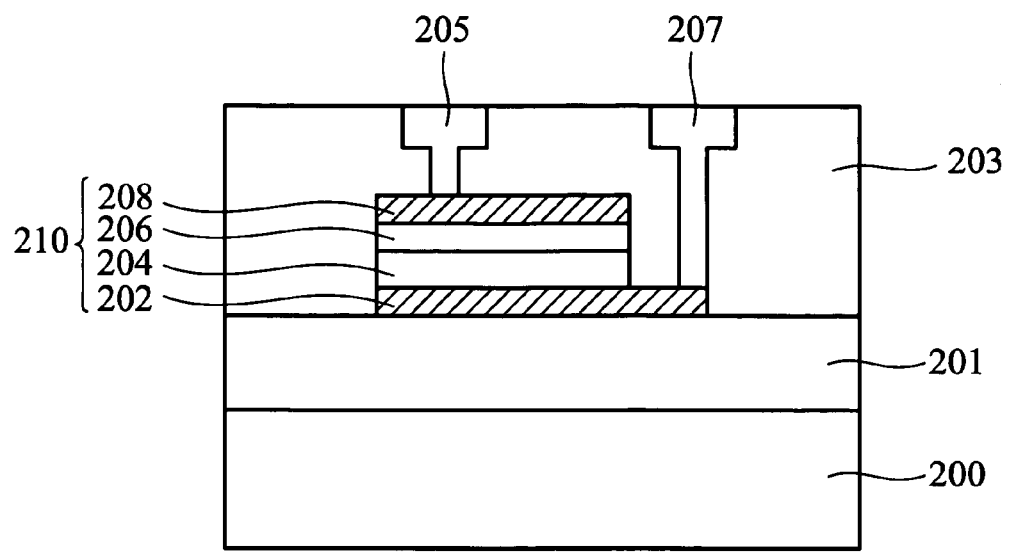
FIG. 2A shows a cross-section of an embodiment of a semiconductor capacitor device having A MIM capacitor with a dual capacitor dielectric.

FIG. 2A illustrates an embodiment of a semiconductor capacitor device having a MIM capacitor with a dual capacitor dielectric. In FIG. 2A, a substrate 200 the same as the substrate 100 shown in FIG. 1A, is provided. A dielectric layer 201, serving as an ILD or IMD layer overlies the substrate 200. The dielectric layer 201 may comprise a material similar to the dielectric layer 101 shown in FIG. 1A. Additionally, a multiple level metal structure may be disposed in the dielectric layer 201, thereby electrically connecting the elements in or on the substrate 100 and the subsequent electronic device thereon. As well as the substrate 200, a flat layer is depicted in order to simplify the diagram.

Another dielectric layer 203 overlies the dielectric layer 201. In this embodiment, the dielectric layer 203 serves as an IMD layer. The dielectric layer 203 may comprise a material similar to the dielectric layer 101 shown in FIG. 1A and be formed by a method similar that of forming dielectric layer 101.

A MIM capacitor 210 is embedded in the dielectric layer 203. In this embodiment, the MIM capacitor 210 may comprise a lower electrode plate 202, a first capacitor dielectric layer 204, a second capacitor dielectric layer 206 and an upper electrode plate 208. The upper and lower electrode plates 208 and 202 may comprise Cu, AlCu or other metal electrode materials well known in the art. The first and second capacitor dielectric layer 204 and 206 may comprise silicon oxide or other material having a dielectric constant (k) higher than silicon oxide, such as silicon nitride, silicon oxynitride, hafnium oxide and tantalum oxide. In particular, in this embodiment, the composition of the first capacitor dielectric layer 204 is different from that of the second capacitor dielectric layer 206. That is, one of the first and second capacitor dielectric layers 204 and 206 requires a negative VCC parabolic characteristic and the other a positive VCC parabolic characteristic. For example, if the first capacitor dielectric layer 204 comprises silicon oxide (negative VCC parabolic characteristic), the second capacitor dielectric layer 206 may comprise a material having a dielectric constant higher than silicon oxide (positive VCC parabolic characteristic), such as silicon nitride or silicon oxynitride. Conversely, the second capacitor dielectric layer 206 may comprise silicon oxide and the first capacitor dielectric layer 204 a material having a dielectric constant higher than silicon oxide, such as silicon nitride or silicon oxynitride. In this embodiment, the thickness of the first capacitor dielectric layer 204 may be substantially equal to or different from the second capacitor dielectric layer 206. Preferably, the capacitor dielectric layer comprising silicon oxide is thicker than that comprising a material having a relatively high dielectric constant.

First and second interconnects 205 and 207 comprising, for example, copper or copper alloy, are formed in the dielectric layer 203 by conventional dual damascene process (i.e. damascene interconnects), electrically connecting the upper electrode plate 208 and the lower electrode plate 202, respectively, serving as the input/output terminals of the semiconductor capacitor device.

Since the semiconductor capacitor device comprises a MIM capacitor using silicon oxide and a high k dielectric material as a dual capacitor dielectric, the invention can provide increased capacitance density as does the related art. Moreover, since the semiconductor capacitor device comprises A MIM capacitor using a dual capacitor dielectric having opposite VCC characteristics, the total VCC value can be minimized by the opposing VCC values canceling each other out, thus increasing the operating voltage range of the integrated circuits using MIM capacitors. Furthermore, the semiconductor capacitor device of the invention may increase the capacitance density without reducing the thickness of the dual capacitor dielectric of the MIM capacitor, preventing an increase in leakage current.

Figure 2B:
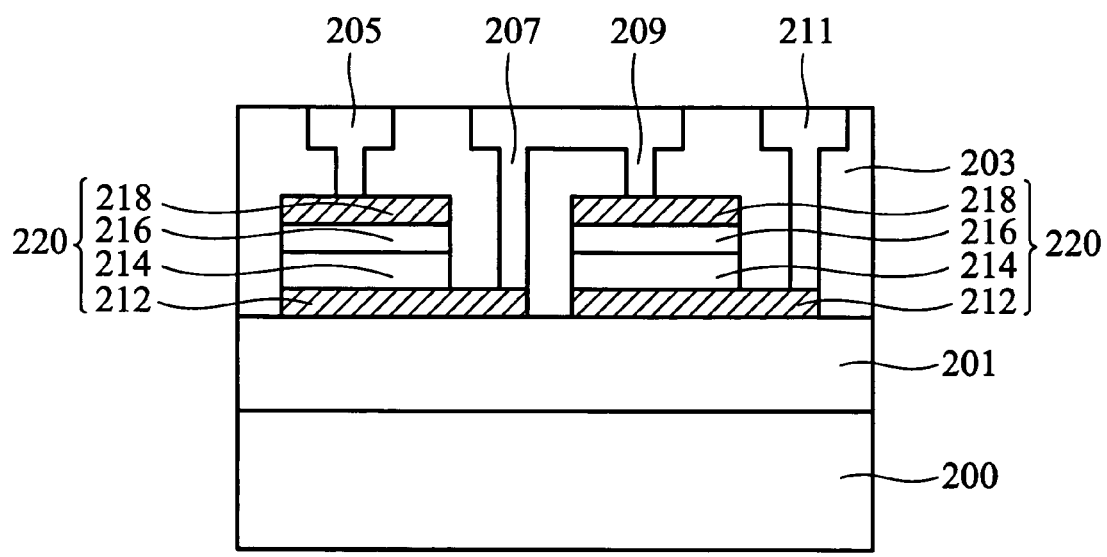
FIG. 2B shows a cross-section of another embodiment of a semiconductor capacitor device having MIM capacitors electrically connected in series.

In some embodiments, the semiconductor capacitor device shown in FIG. 2A may further comprise a second MIM capacitor 220 disposed in the dielectric layer 220, which is adjacent to and electrically connected in series with the MIM capacitor 210, as shown in FIG. 2B. The second MIM capacitor 220 comprises a lower electrode plate 212, a third capacitor dielectric layer 214, a fourth capacitor dielectric layer 216 and an upper electrode plate 218. The upper and lower electrode plates 218 and 212 may comprise Cu, AlCu or other metal electrode materials well known in the art. The third and fourth capacitor dielectric layer 214 and 216 may comprise silicon oxide or other material having a dielectric constant (k) higher than silicon oxide, as same as the first and second capacitor dielectric layer 204 and 206. In particular, one of the third and fourth capacitor dielectric layers 214 and 216 requires a negative VCC parabolic characteristic and the other a positive VCC parabolic characteristic, as mentioned. That is, one of the first and second capacitor dielectric layers 204 and 206 and one of the third and fourth capacitor dielectric layers 214 and 216 may comprise silicon oxide and the other may comprise silicon nitride, silicon oxynitride or other high k materials. In this embodiment, the thicknesses of the first, second, third and fourth capacitor dielectric layers 204, 206, 214 and 216 may be the same or different. Preferably, the capacitor dielectric layers comprising silicon oxide are thicker than that comprising a material having a relatively high dielectric constant.

Third and fourth damascene interconnects 209 and 211 comprising, for example, copper or copper alloy, are formed in the dielectric layer 203, electrically connecting the upper electrode plate 218 and the lower electrode plate 212, respectively. In particular, the MIM capacitors 210 and 220 are electrically connected in series by electrically connecting the third damascene interconnect 209 to the second damascene interconnect 207. In some embodiments, the third damascene interconnect 209 may electrically connect the first damascene interconnect 205 or the fourth damascene interconnect 211 may electrically connect the first damascene interconnect 205 or the second damascene interconnect 207, such that the MIM capacitors 210 and 220 are electrically connected in series.

Since the semiconductor capacitor device comprises two MIM capacitors electrically connected in series and using silicon oxide and a high k dielectric material as a dual capacitor dielectric, the invention can provide increased capacitance density as does the related art. Moreover, since the dual capacitor dielectric have opposite VCC characteristics, the total VCC value can be further minimized to increase the operating voltage range of the integrated circuits using MIM capacitors. Furthermore, the semiconductor capacitor device comprising two MIM capacitors electrically connected in series can further reduce leakage current.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor capacitor device, comprising:
  a dielectric layer on a substrate; and
  a stack capacitor structure disposed in the dielectric layer, comprising first and overlying second MIM capacitors electrically connected in parallel, wherein the first and second MIM capacitors have individual upper and lower electrode plates and different materials of capacitor dielectric layers completely covered by the corresponding upper electrode plate.

2. The semiconductor capacitor device as claimed in claim 1, further comprising:

a plurality of first interconnects disposed in the dielectric layer, electrically connecting the upper electrode plate of the first MIM capacitor and the lower electrode plate of the second MIM capacitor; and a plurality of second interconnects disposed in the dielectric layer, electrically connecting the lower electrode plate of the first MIM capacitor and the upper electrode plate of the second MIM capacitor.

3. The semiconductor capacitor device as claimed in claim 2, wherein the plurality of the first interconnects underlies the second MIM capacitor and overlaps the capacitor dielectric layer thereof.

4. The semiconductor capacitor device as claimed in claim 2, wherein the plurality of the first interconnects underlies the second MIM capacitor without overlapping the capacitor dielectric layer thereof.

5. The semiconductor capacitor device as claimed in claim 1, wherein one of the capacitor dielectric layers comprises silicon oxide and the other comprises a material having a dielectric constant higher than silicon oxide.

6. The semiconductor capacitor device as claimed in claim 1, wherein one of the capacitor dielectric layers comprises silicon nitride or silicon oxynitride and the other comprises silicon oxide.

7. The semiconductor capacitor device as claimed in claim 1, wherein the capacitor dielectric layer of the first MIM capacitor has a thickness substantially equal to the capacitor dielectric layer of the second MIM capacitor.

8. The semiconductor capacitor device as claimed in claim 1, wherein the capacitor dielectric layer of the first MIM capacitor has a thickness different from the capacitor dielectric layer of the second MIM capacitor.

9. The semiconductor capacitor device as claimed in claim 1, wherein the upper and lower electrode plates of the first and second MIM capacitors comprise Cu or AlCu.

10. The semiconductor capacitor device as claimed in claim 1, wherein the dielectric layer comprises a low k dielectric material.

11. A semiconductor capacitor device, comprising:
a dielectric layer on a substrate; and
a stack capacitor structure disposed in the dielectric layer, comprising a first MIM capacitor having a capacitor dielectric layer with negative voltage linearity coefficient parabolic characteristic and a second MIM capacitor having a capacitor dielectric layer with positive voltage linearity coefficient parabolic characteristic, electrically connected in parallel, wherein the first and second MIM capacitors have individual upper and lower electrode plates.

12. The semiconductor capacitor device as claimed in claim 11, further comprising:
a plurality of first interconnects disposed in the dielectric layer, electrically connecting the upper electrode plate of the first MIM capacitor and the lower electrode plate of the second MIM capacitor; and a plurality of second interconnects disposed in the dielectric layer, electrically connecting the lower electrode plate of the first MIM capacitor and the upper electrode plate of the second MIM capacitor.

13. The semiconductor capacitor device as claimed in claim 12, wherein the plurality of the first interconnects underlies the second MIM capacitor and overlaps the capacitor dielectric layer thereof.

14. The semiconductor capacitor device as claimed in claim 12, wherein the plurality of the first interconnects underlies the second MIM capacitor without overlapping the capacitor dielectric layer thereof.

15. The semiconductor capacitor device as claimed in claim 11, wherein the capacitor dielectric layer of the first MIM capacitor has a thickness substantially equal to the capacitor dielectric layer of the second MIM capacitor.

16. The semiconductor capacitor device as claimed in claim 11, wherein the capacitor dielectric layer of the first MIM capacitor has a thickness different from the capacitor dielectric layer of the second MIM capacitor.

17. The semiconductor capacitor device as claimed in claim 11, wherein the capacitor dielectric layer with negative voltage linearity coefficient parabolic characteristic comprises silicon oxide.

18. The semiconductor capacitor device as claimed in claim 11, wherein the capacitor dielectric layer with positive voltage linearity coefficient parabolic characteristic comprises silicon nitride or silicon oxynitride.

19. A semiconductor capacitor device, comprising:
a dielectric layer on a substrate;
a stack capacitor structure disposed in the dielectric layer, comprising a first MIM capacitor using silicon oxide as a capacitor dielectric layer and a second MIM capacitor using a high k dielectric material as a capacitor dielectric layer, electrically connected in parallel, wherein the first and second MIM capacitors have individual upper and lower electrode plates;
a plurality of first interconnects disposed in the dielectric layer, electrically connecting the upper electrode plate of the first MIM capacitor and the lower electrode plate of the second MIM capacitor; and a plurality of second interconnects disposed in the dielectric layer, electrically connecting the lower electrode plate of the first MIM capacitor and the upper electrode plate of the second MIM capacitor.

20. The semiconductor capacitor device as claimed in claim 19, wherein the high k dielectric material comprises titanium oxide, barium strontium titanate, zirconium oxide, hafnium silicon oxide, zirconium silicon oxide, hafnium aluminum oxide, zirconium aluminum oxide, or strontium titanium oxide.

* * * * *